(12) United States Patent
Goodner et al.

(10) Patent No.: US 7,294,568 B2
(45) Date of Patent: Nov. 13, 2007

(54) FORMATION OF AIR GAPS IN AN INTERCONNECT STRUCTURE USING A THIN PERMEABLE HARD MASK AND RESULTING STRUCTURES

(75) Inventors: Michael D. Goodner, Hillsboro, OR (US); Kevin P. O'Brien, Portland, OR (US); Grant M. Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 10/922,617

(22) Filed: Aug. 20, 2004

(65) Prior Publication Data

US 2006/0040492 A1    Feb. 23, 2006

(51) Int. Cl.
*H01L 21/4763* (2006.01)
*H01L 21/764* (2006.01)

(52) U.S. Cl. ................. 438/619; 438/421; 438/422

(58) Field of Classification Search ............. 438/421, 438/422, 619
See application file for complete search history.

(56) References Cited

U.S. PATENT DOCUMENTS

| | | | |
|---|---|---|---|
| 5,912,313 A | 6/1999 | McIntosh, III et al. | |
| 6,121,340 A | 9/2000 | Shick et al. | |
| 6,156,890 A | 12/2000 | Platzek et al. | |
| 6,232,417 B1 | 5/2001 | Rhodes et al. | |
| 6,413,852 B1* | 7/2002 | Grill et al. | 438/619 |
| 6,417,092 B1* | 7/2002 | Jain et al. | 438/624 |
| 6,455,650 B1 | 9/2002 | Lipian et al. | |
| 6,555,467 B2* | 4/2003 | Hsu et al. | 438/633 |
| 6,780,755 B2* | 8/2004 | Wade | 438/622 |
| 2004/0063305 A1 | 4/2004 | Kloster | |
| 2004/0099951 A1 | 5/2004 | Park | |
| 2004/0102031 A1 | 5/2004 | Kloster | |

OTHER PUBLICATIONS

D. Bhusari et al., "Fabrication of Air-Channel Structures for Microfluidic, Microelectromechanical, and Microelectronic Applications", Journal of Microelectricalmechanical Systems, vol. 10, No. 3, pp. 400-408 (Sep. 2001).
M. Wedlake et al., "Thermal Decomposition Kinetics of Functionalized Polynorbornene", J. Materials Research, vol. 17, No. 3, pp. 632-640, (Mar. 2002).

* cited by examiner

*Primary Examiner*—Mary Wilczewski
*Assistant Examiner*—Pamela E Perkins (57) ABSTRACT

A method of forming air gaps in the interconnect structure of an integrated circuit device. The air gaps may be formed by depositing sacrificial layer over a dielectric layer and then depositing a permeable hard mask over the sacrificial layer. The sacrificial layer is subsequently removed to form air gaps. The permeable hard mask may have a thickness of less than approximately 250 nm, and internal stresses within the permeable hard mask may be controlled to prevent deformation of this layer. Other embodiments are described and claimed.

25 Claims, 7 Drawing Sheets

FORMATION OF AIR GAPS IN AN INTERCONNECT STRUCTURE USING A THIN PERMEABLE HARD MASK AND RESULTING STRUCTURES

FIELD OF THE INVENTION

The invention relates generally to the manufacture of integrated circuit devices and, more particularly, to a thin permeable hard mask for use in fabricating an interconnect structure having air gaps.

BACKGROUND OF THE INVENTION

An integrated circuit (IC) device typically comprises a semiconductor die in which circuitry has been formed, this circuitry including a collection of circuit elements such as transistors, diodes, capacitors, resistors, etc. To provide electrical connections between the die and a next-level component (e.g., a package substrate), an interconnect structure is formed over a surface of the die. The interconnect structure may comprise a number of levels of metallization, each layer of metallization separated from adjacent levels by a layer of dielectric material (or other insulating material) and interconnected with the adjacent levels by vias. The dielectric layers of the interconnect structure are often each referred to as an "interlayer dielectric" (or "ILD"). The metallization on each layer comprises a number of conductors (e.g., traces) that may route signal, power, and ground lines to and from the circuitry formed on the die.

For some IC device applications, it may be desirable to increase the I/O (input/output) density of a semiconductor die while also reducing the size of the die. To achieve such a result, it may be necessary to decrease the spacing between conductive traces in the interconnect structure formed on the die. Space reductions may include reducing the spacing between traces in the same level of metallization, as well as reducing the spacing between traces in adjacent metallization levels. As the spacing between conductors of an interconnect structure decreases, the potential for coupling capacitance between closely spaced traces and propagation delays may significantly increase. The coupling capacitance and propagation delays may be minimized by reducing the dielectric constant of the material—or, more generally, the "effective" dielectric constant of the space or volume—that separates the conductive traces of the interconnect structure.

One way to reduce the coupling capacitance and propagation delays is to utilize new materials having a low dielectric constant (k) to construct the ILD layers of the interconnect structure. However, the introduction of a new material into the manufacturing process may present numerous integration challenges, as the new material's characteristics may affect all facets of production (e.g., thin film deposition, lithography, etching, etc.).

Another solution for lowering the dielectric constant of the ILD layers of an interconnect structure is to introduce air gaps (k=1) proximate to the conductive traces, thereby reducing the effective dielectric constant of the space between adjacent traces. One scheme that has been suggested for the formation of air gaps is to form the traces in an ILD layer, and then selectively remove the ILD material, leaving only the metal traces. The stand-alone metal traces may, however, lack adequate structural support.

A second approach that has been suggested for the formation of air gaps is to pattern the air gaps into the ILD next to the metal conductors. However, this approach will require additional lithography steps and, further, the feature size of the air gaps may exceed the limits of conventional lithography processes. In addition, air gap formation may necessitate the etching of a deep, narrow trench, which can be difficult to achieve.

DETAILED DESCRIPTION OF THE INVENTION

Disclosed in the following text are various embodiments of a method of forming air gaps—in, for example, the interconnect structure of an IC device—using a thin permeable hard mask. Also disclosed are various embodiments of devices including one or more thin permeable hard mask layers and associated air gaps. When introduced into the interconnect structure of an IC device, the air gaps formed with such a thin permeable hard mask may provide for a decrease in the effective dielectric constant of the ILD layer. In one embodiment, a thin permeable hard mask is deposited over a sacrificial layer, the sacrificial layer overlying a dielectric layer, and the sacrificial layer is ultimately removed to form an air gap between the dielectric layer and the permeable hard mask. The air gap surrounds at least portions of one or more conductors formed within the dielectric layer. In one embodiment, the permeable hard mask has a thickness less than approximately 250 nm, and in another embodiment the permeable hard mask has a thickness of between 50 and 100 nm. In a further embodiment, compressive internal stresses within the permeable hard mask layer are less then 200 MPa, and in yet another embodiment the internal stresses within the hard mask are tensile.

Figure 1:
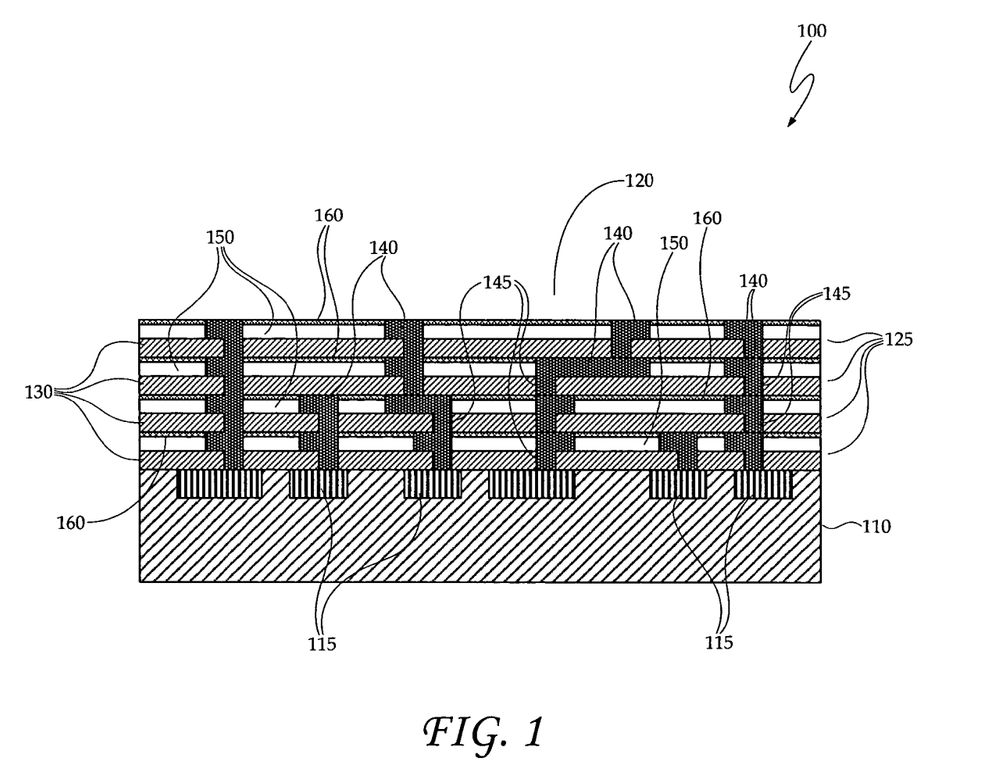
FIG. 1 is a cross-sectional schematic diagram illustrating an embodiment of an interconnect structure of a die, the interconnect structure including air gaps formed according to the disclosed embodiments.

Referring now to FIG. 1, illustrated is an embodiment of an IC device 100 including air gaps formed according to the disclosed embodiments. The IC device 100 comprises a die 110 in which circuitry 115 has been formed. The circuitry 115 formed on die 110 may include a number of circuit elements (e.g., transistors, diodes, capacitors, resistors, etc.), as well as various signal lines that interconnect these elements. The die 110 may comprise any suitable semiconductor material, such as silicon (Si), silicon-on-insulator (SOI), gallium arsenide (GaAs), etc.

Disposed on the die 110 is an interconnect structure 120. The interconnect structure 120 includes a number of levels of metallization 125. Each level 125 comprises a number of conductors 140 (e.g., traces) and a layer of dielectric material 130. The conductors 140 are disposed within and/or are supported by the dielectric layer 130. Each level of metallization 125 also includes a layer of permeable material 160 and one or more air gaps 150 disposed between the permeable layer 160 and the dielectric layer 130 of that level. The permeable material layer may also be referred to as a permeable "hard mask." The permeable hard mask layers 160 provide structural integrity for the interconnect structure 120, and these permeable layers also assist in the formation of the air gaps 150, as will be described below.

Within a given level, the conductors 140 are at least partially surrounded by some of the air gaps 150. The air gaps of a given level (perhaps in combination with the dielectric layer 130 of that level) separate these conductors from one another. The air gaps 150 (k=1) formed above the dielectric material layer 130 (e.g., $2.5 \geq k \geq 4.5$) can reduce the effective dielectric constant of the space or volume separating adjacent levels of metallization 125, thereby reducing coupling capacitance and propagation delays.

The conductors 140 in any given level 125 are separated from the conductors of adjacent levels by the dielectric layer 130 (perhaps in combination with the air gaps 150), and the conductors 140 of adjacent levels 125 are electrically interconnected by conductive vias 145 extending between these levels. The conductive vias 145 of a given level 125 extend through at least the dielectric layer 130 to a conductor in an underlying level.

The permeable hard mask material 160 may comprise any material providing a non-hermetic layer which allows for gas permeation. The permeability of the hard mask material enables the removal of a sacrificial material layer by thermal decomposition (or other process) to form air gaps 150, as will be described below in greater detail. In one embodiment, a permeable hard mask 160 has a thickness of less than approximately 250 nm, and in another embodiment the permeable hard mask has a thickness of between approximately 50 and 100 nm. In a further embodiment, the internal stresses within a permeable hard mask layer 160 are between approximately −200 MPa (compressive) and zero, and in a yet another embodiment the internal stresses within the permeable layer are tensile. Examples of suitable hard mask materials include SiN, SiCN, $SiO_2$, SiON, SiOC, and SiC, as well as combinations of these materials. Deposition of the permeable hard mask layer 160 is described below in greater detail.

The conductors 140 and vias 145 may comprise any suitable conductive material, such as copper (Cu), aluminum (Al), gold (Au), silver (Ag), or alloys of these and/or other materials. The dielectric material 130 may comprise any suitable dielectric or insulating material, such as silicon dioxide ($SiO_2$), SiOF, carbon-doped oxide (CDO), a glass, or a polymer material.

Figure 2:
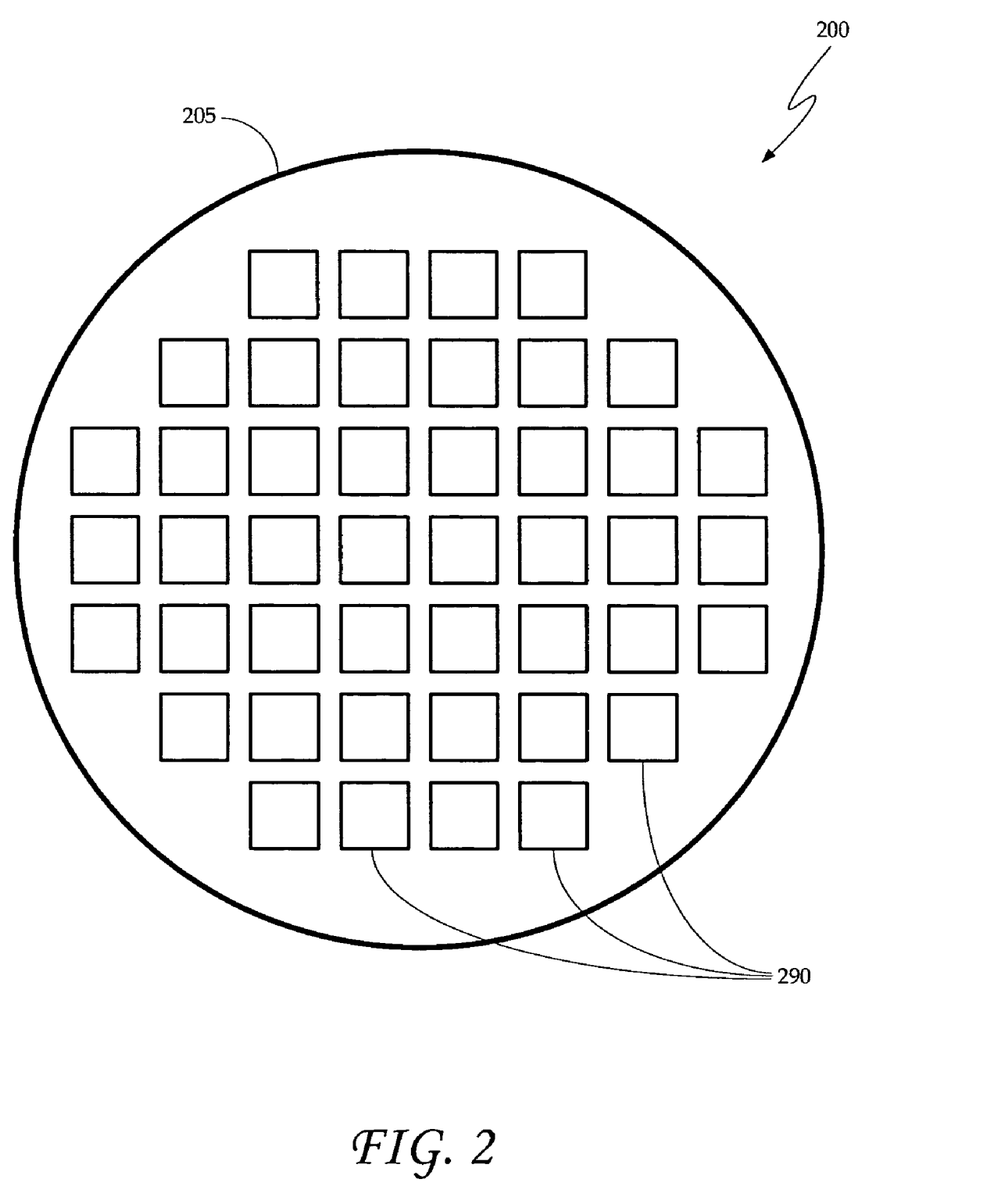
FIG. 2 is a schematic diagram illustrating an embodiment of a wafer upon which air gaps have been formed according to the disclosed embodiments.

Although one IC device 100 comprising a single die 110 is shown in FIG. 1, it should be understood that the embodiments of a method for forming air gaps, which are to be described below, are typically performed at the wafer level. This is further illustrated in FIG. 2, which shows a plan view of a wafer 200. The wafer 200 comprises a substrate 205 (e.g., Si, SOI, GaAs, etc.) upon which integrated circuitry for a number of die 290 has been formed, and wafer 200 is ultimately cut into these separate die 290. Prior to singulation of the die 290, a number of levels of metallization will be formed over a surface of the wafer 200 to form the interconnect structure for each die 290 (e.g., the interconnect structure 120, as shown in FIG. 1).

At this juncture, it should be noted that, in FIG. 1, only a limited number of circuit elements 115, conductors 140, and vias 145 are shown for ease of illustration. However, as the reader will appreciate, the integrated circuitry 115 formed on die 110 may, in practice, includes tens of millions, or even hundreds of millions, of individual circuit elements and, further, that the interconnect structure 120 may include several hundred or even thousands of conductors 140 and vias 145. Thus, it should be understood that FIG. 1 (as well as FIGS. 4A-4E) are simplified schematic representations of the IC device 100 presented merely as an aid to understanding the disclosed embodiments and, further, that no unnecessary limitations should be drawn from these schematic representations.

Figure 3:
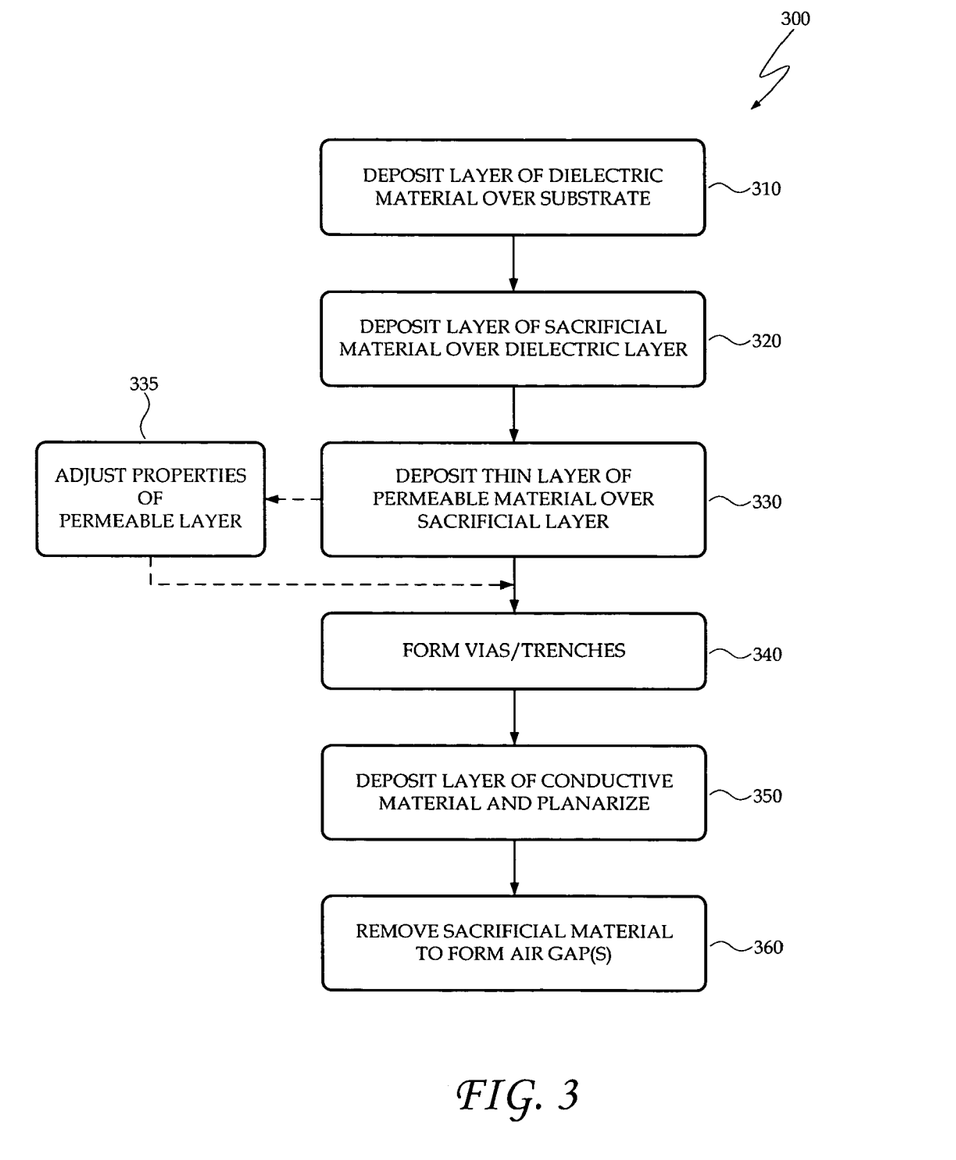
FIG. 3 is a block diagram illustrating an embodiment of a method of forming air gaps.

An embodiment of a method 300 of forming air gaps in a dielectric material is illustrated in FIG. 3. The method shown in FIG. 3 is further illustrated in the schematic diagrams of FIGS. 4A through 4E, and reference should be made to these figures as called out in the text.

Figure 4A:
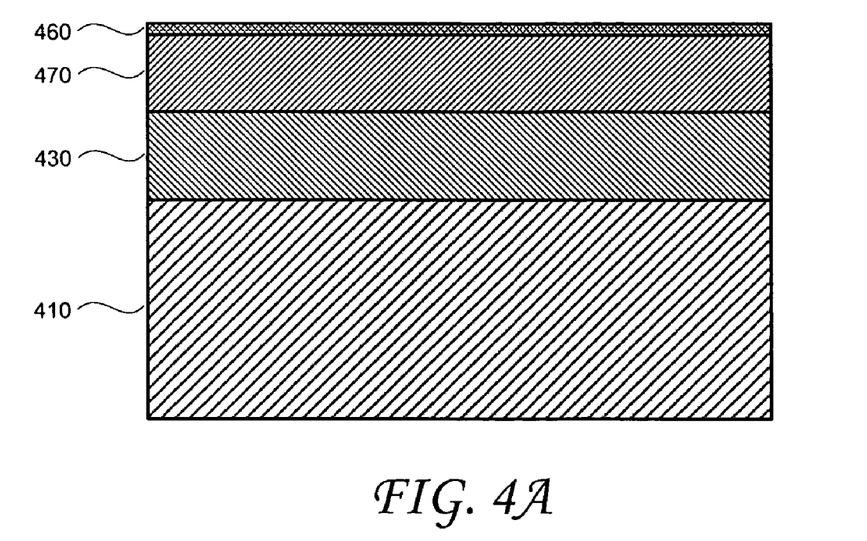
FIGS. 4A-4E are schematic diagrams which illustrate embodiments of the method shown in FIG. 3.

Turning now to FIG. 3, and block 310 in particular, a layer of dielectric material is deposited over a substrate (or other underlying layer, such as a prior level of metallization). This is illustrated in FIG. 4A, which shows a layer of dielectric material 430 that has been deposited over a substrate 410. The substrate 410 comprises, in one embodiment, a semiconductor wafer (e.g., Si, SOI, GaAs, etc.) upon which integrated circuitry for a number of die has been formed. The dielectric layer 430 may comprise any suitable dielectric or insulating material (e.g., $SiO_2$, SiOF, CDO, glass, polymer, etc.), and the dielectric layer may be deposited using any suitable deposition technique, such as a spin-on process, chemical vapor deposition (CVD), physical vapor deposition (PVD), etc. In one embodiment, the dielectric layer 430 has a thickness up to approximately 1,000 nm.

Referring to block 320, a layer of a sacrificial material is deposited over the dielectric layer. This is also illustrated in FIG. 4A, which shows a layer of sacrificial material 470 that has been deposited over the dielectric layer 430. The sacrificial material 470 may comprise any suitable material that is amenable to removal by thermal decomposition (or other process), as described below. Examples of materials which may be suitable for use as the sacrificial material include: poly propylene oxide (PPO), polymethylstyrene (PMS), polyoxymethylene (POM), polycaprolactone, polycarbonate, polyamideimide (PAI), Polyamide-6,6, polyphthalamide (PPA), polyetherketone (PEK), polyethretherketone (PEEK), polybutyllene terephthalate (PBT), polyethylene terephthalate (PET), polystyrene (PS), polystyrene-syndiotactic, polyphenylene sulfide (PPS), polyether sulfone (PES), and polynorbornene. The sacrificial layer 470 may be deposited using any suitable deposition technique, such as a spin-on process, CVD, PVD, etc. In one embodiment, the sacrificial layer 470 has a thickness up to approximately 1,000 nm.

As set forth in block 330, a thin layer of a permeable material is deposited over the sacrificial layer. This is also illustrated in FIG. 4A, which shows a layer of a permeable material 460 that has been deposited over the sacrificial layer 470. The permeable material 460 may comprise any suitable material providing a non-hermetic layer that allows for permeation of the sacrificial material 470 during removal (e.g., thermal decomposition) of the sacrificial layer. The permeability of the hard mask may be a characteristic of the material itself, or this layer's permeability may be the result of the deposition technique used to form this layer (or a combination of both). By way of example, the permeable material 460 may comprise SiN, SiC, SiCN, SiON, SiOC, or $SiO_2$. Any suitable deposition technique may be used to form the permeable layer or hard mask (e.g., CVD, PVD, etc.). In one embodiment, the permeable hard mask 460 has a final thickness of less than approximately 250 nm, and in a further embodiment, the permeable layer 460 has a final thickness of between approximately 50 and 100 nm. It should be noted that some of the permeable hard mask layer 460 may be removed in a subsequent planarization process and, therefore, the final thickness of the permeable hard mask may be a function of the initial deposition thickness as well as the amount of material removed during any subsequent planarization step.

In a further embodiment, as set forth in block 335, one or more properties of the permeable layer are adjusted and/or altered during the deposition process. According to one embodiment, the internal stresses within the permeable layer are adjusted during deposition to achieve a desired upper (or lower) bound of these stresses. In one embodiment, the internal stresses within the permeable layer are between approximately −200 MPa (compressive) and zero (0). In a further embodiment, the internal stresses within the permeable layer 460 are tensile stresses. As will be described below, the permeable hard mask 460 will be subjected to both an etching process and a thermal decomposition process (of the sacrificial layer 470). Due at least in part to the thinness (e.g., <250 nm) of the hard mask layer 460, the etching and thermal decomposition processes can result in deformation (e.g., buckling, blistering, etc.) of the permeable layer. This deformation may, however, be prevented or at least minimized by controlling the internal stresses (e.g., minimizing the compressive stresses) within the permeable layer, such that the permeable layer can freely relax. It should be understood that other characteristics, such as the permeability, may also be adjusted and/or altered during deposition.

By way of example, the permeable hard mask 460 may be deposited using a chemical vapor deposition (CVD) process or a plasma enhanced CVD (PECVD) process. Factors that may impact the internal stresses within the hard mask material may include: density, carbon content, the percentage of either Si—C or Si—N bonds (depending upon film type), the deposition temperature, the coefficient of thermal expansion (CTE) of the hard mask layer, as well as the CTE mismatch between the hard mask layer and any underlying layers (e.g., substrate 410 and/or dielectric layer 430). Any one or more of these factors (or other factors) may be adjusted during deposition to alter the characteristics (e.g., internal stress) of the permeable hard mask layer 460.

Figure 4B:
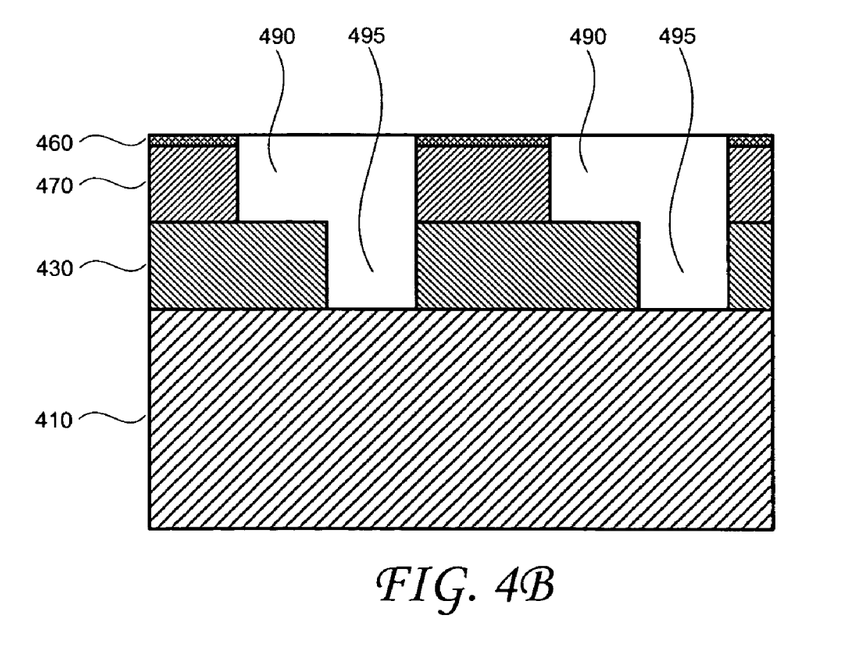

Referring next to block 340, a trench and/or via are formed. This is illustrated in FIG. 4B, which shows trenches 490 and vias 495. The trenches 490 extend through the permeable hard mask 460 and into the sacrificial layer 470. In one embodiment, the trenches 490 extend through the sacrificial layer 470 to the dielectric layer 430, and in another embodiment, the trenches extend at least partially into the dielectric layer 430. Each via 495 has one end opening into a trench 490, whereas an opposing end of the via extends down through the dielectric layer 430 to a conductor (not shown in FIGS. 4A-4E) in the substrate 410 (or other underlying layer). In one embodiment, the trenches 490 and vias 495 are formed according to a via-first dual-damascene process (which may be either a full via-first process or a partial via-first process), and in another embodiment, the trenches and vias are formed according to a trench-first dual damascene process. It should be understood that the disclosed embodiments are not limited to dual-damascene structures and that other structures may be formed (e.g., a trench only, a via only, etc.).

Figure 4C:
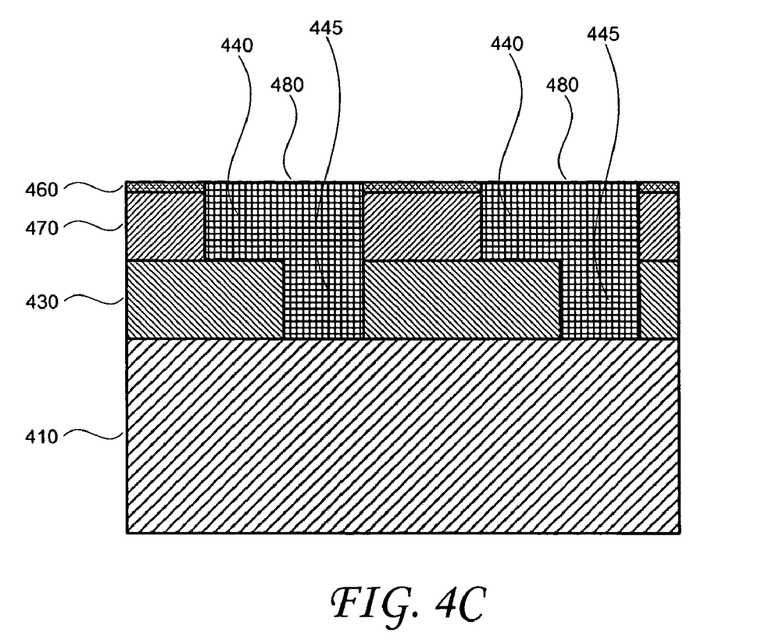

As set forth in block 350, a layer of a conductive material is deposited and subsequently planarized to fill the trenches and vias with the conductive material. This is illustrated in FIG. 4C, where a conductive material 480 has been deposited in the trenches to form conductors 440 (e.g., traces) and, further, within the vias to form conductive vias 445. In one embodiment, the conductive material 480 comprises copper or a copper alloy. However, this material may comprise any other suitable conductor, such as aluminum, gold, silver, or alloys of these and/or other materials. The conductive material 480 may be deposited using any suitable deposition technique—e.g., sputtering or other PVD process, CVD, ALD (atomic layer deposition), electroplating, electroless plating, etc.—and a seed layer of the conductive material may be laid down prior to deposition, if desired.

Any suitable process, such as chemical-mechanical polishing (CMP) or etching, may be employed to remove any excess conductive material and planarize this layer (to achieve the structure shown in FIG. 4C). As previously noted, some of the permeable hard mask layer 460 may also be removed during this planarization process. For example, should a hard mask layer 460 having a thickness of approximately 100 nm be desired and it is expected that 50 nm of the hard mask will be removed during planarization, the permeable hard mask may be deposited (at block 330) to an initial thickness of 150 nm.

Figure 4D:
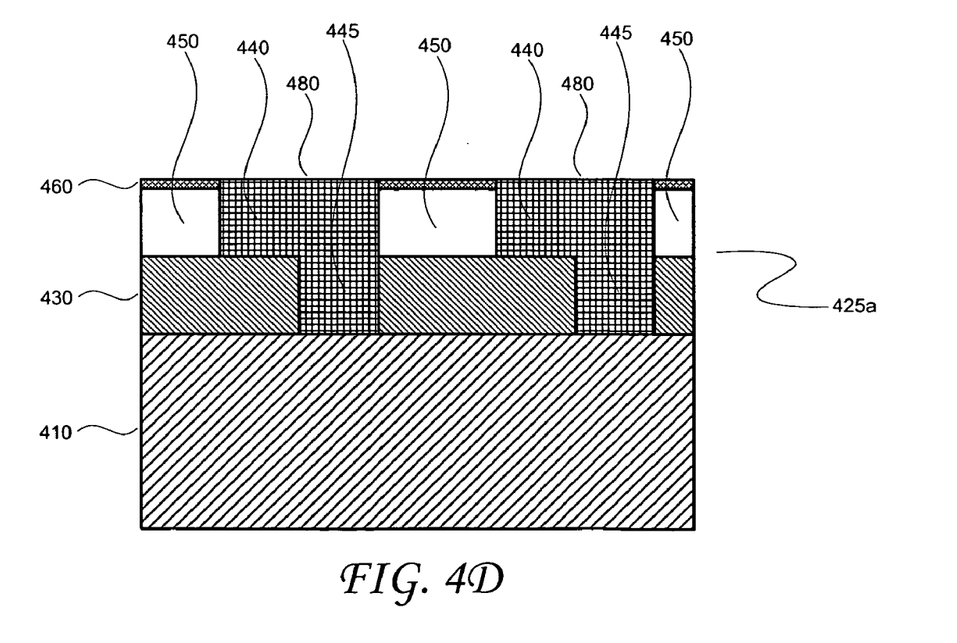
Figure 4E:
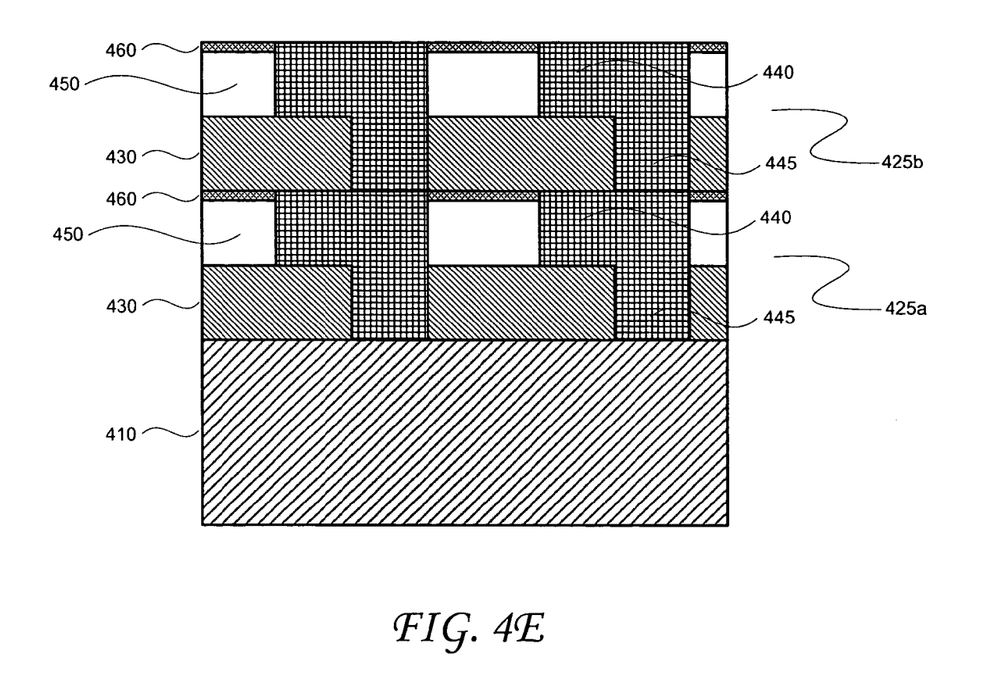

Referring to block 360, the sacrificial layer is removed to form air gaps. This is illustrated in FIG. 4D, where the sacrificial layer 470 has been removed to form air gaps 450. The sacrificial material may be removed by any process that can extract the sacrificial material 470 through the permeable hard mask 460. In one embodiment, the sacrificial material 470 is removed using a thermal decomposition process. As the sacrificial material 470 thermally decomposes into a gas (or mixture of gases), these gases will permeate through the hard mask 460. However, due at least in part to the thinness of the permeable hard mask (e.g., <250 nm), the hard mask may be subject to rupture and/or blistering as pressure builds up due to thermal decomposition. According to one embodiment, thermal decomposition is performed using a temperature-time profile that is optimized to prevent pressure build-up and blistering of the permeable hard mask 460. For example, thermal decomposition may be performed at a temperature of 375 degrees C. for between 4 and 8 hours. The air gaps 450 may, in one embodiment, have a thickness up to approximately 1,000 nm.

Thus far, a single level of metallization 425a has been formed, as shown in FIG. 4D. However, it should be understood that the above-described process shown and FIG. 3 and in FIGS. 4A-4D can be used to form additional levels of metallization in an interconnect structure. This is illustrated, by way of example, in FIG. 4E, where an additional level of metallization 425b has been formed over the initial level 425a. The second level 425b includes a permeable hard mask 460 and air gaps 450 that have been formed as described above. An interconnect structure having any suitable number of levels of metallization may be formed according to the disclosed embodiments. It should also be understood that removal of the sacrificial material 470 to form air gaps 450 may either be performed after formation of each layer of an interconnect structure (preceding the formation of the next layer) or performed for all layers simultaneously after all interconnect layers have been formed, depending upon the desired integration scheme and the nature of the removal process.

Figure 5:
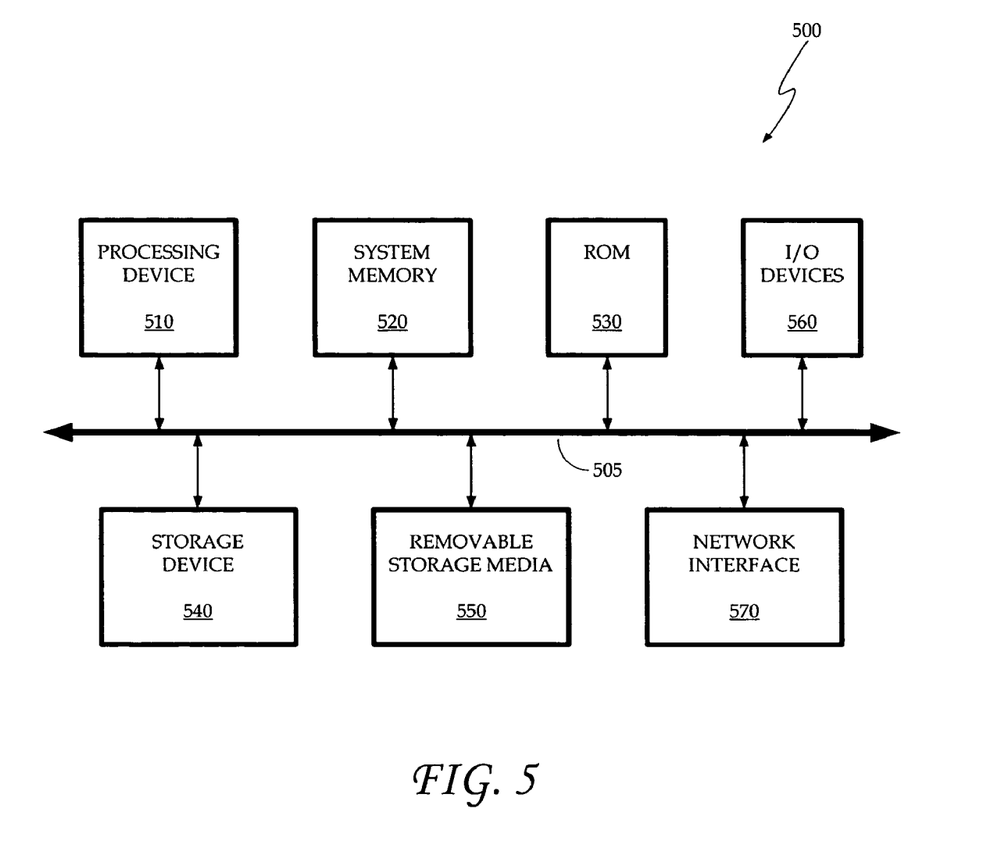
FIG. 5 is a schematic diagram illustrating an embodiment of a computer system, which may include a component formed according to the disclosed embodiments.

Referring to FIG. 5, illustrated is an embodiment of a computer system 500. Computer system 500 includes a bus 505 to which various components are coupled. Bus 505 is intended to represent a collection of one or more buses—e.g., a system bus, a Peripheral Component Interface (PCI) bus, a Small Computer System Interface (SCSI) bus, etc.—that interconnect the components of system 500. Representation of these buses as a single bus 505 is provided for ease of understanding, and it should be understood that the system 500 is not so limited. Those of ordinary skill in the art will appreciate that the computer system 500 may have any suitable bus architecture and may include any number and combination of buses.

Coupled with bus 505 is a processing device (or devices) 510. The processing device 510 may comprise any suitable processing device or system, including a microprocessor, a network processor, an application specific integrated circuit (ASIC), or a field programmable gate array (FPGA), or similar device. It should be understood that, although FIG. 5 shows a single processing device 510, the computer system 500 may include two or more processing devices.

Computer system 500 also includes system memory 520 coupled with bus 505, the system memory 510 comprising, for example, any suitable type and number of memories, such as static random access memory (SRAM), dynamic random access memory (DRAM), synchronous DRAM (SDRAM), or double data rate DRAM (DDRDRAM). During operation of computer system 500, an operating system and other applications may be resident in the system memory 520.

The computer system 500 may further include a read-only memory (ROM) 530 coupled with the bus 505. During operation, the ROM 530 may store temporary instructions and variables for processing device 510. The system 500 may also include a storage device (or devices) 540 coupled with the bus 505. The storage device 540 comprises any suitable non-volatile memory, such as, for example, a hard disk drive. The operating system and other programs may be stored in the storage device 540. Further, a device 550 for accessing removable storage media (e.g., a floppy disk drive or a CD ROM drive) may be coupled with bus 505.

The computer system 500 may also include one or more I/O (Input/Output) devices 560 coupled with the bus 505. Common input devices include keyboards, pointing devices such as a mouse, as well as other data entry devices, whereas common output devices include video displays, printing devices, and audio output devices. It will be appreciated that these are but a few examples of the types of I/O devices that may be coupled with the computer system 500.

The computer system 500 further comprises a network interface 570 coupled with bus 505. The network interface 570 comprises any suitable hardware, software, or combination of hardware and software that is capable of coupling the system 500 with a network (e.g., a network interface card). The network interface 570 may establish a link with the network (or networks) over any suitable medium—e.g., wireless, copper wire, fiber optic, or a combination thereof—supporting the exchange of information via any suitable protocol—e.g., TCP/IP (Transmission Control Protocol/Internet Protocol), HTTP (Hyper-Text Transmission Protocol), as well as others.

It should be understood that the computer system 500 illustrated in FIG. 5 is intended to represent an exemplary embodiment of such a system and, further, that this system may include many additional components, which have been omitted for clarity and ease of understanding. By way of example, the system 500 may include a DMA (direct memory access) controller, a chip set associated with the processing device 510, additional memory (e.g., a cache memory), as well as additional signal lines and buses. Also, it should be understood that the computer system 500 may not include all of the components shown in FIG. 5.

In one embodiment, the integrated circuit device 100 of FIG. 1—which has air gaps 150 formed according to the disclosed embodiments—comprises a component of the computer system 500. For example, the processing device 510 of system 500 may be embodied as the IC device 100. However, it should be understood that other components of system 500 (e.g., system memory 520, network interface 570, etc.) may include a device having air gaps formed according to any of the disclosed embodiments.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
depositing a layer of a dielectric material over at least a portion of a surface of an underlying layer;
depositing a layer of a sacrificial material over the dielectric layer;
depositing a layer of a permeable material over the sacrificial layer, the permeable layer having a thickness of less than approximately 250 nm and internal compressive stresses of less than approximately 200 MPa, wherein internal stresses in the permeable layer are tensile;
forming a trench and a via, the trench extending through at least the permeable layer and to the sacrificial layer, the via having one end opening into the trench and an opposing end extending down to a conductor in the underlying layer;
depositing a conductive material within the via and the trench; and
thermally decomposing the sacrificial layer to allow the sacrificial material to escape through the permeable layer to form air gaps surrounding at least portions of the conductive material within the trench.

2. The method of claim 1, wherein the permeable material comprises a material selected from a group consisting of SiN, SiC, SiCN, SiON, SiOC, and $SiO_2$.

3. The method of claim 1, wherein the thickness of the permeable layer is between approximately 50 and 100 nm.

4. The method of claim 1, wherein the conductive material comprises copper.

5. The method of claim 1, further comprising removing excess conductive material from an upper surface of the permeable layer using a chemical-mechanical polishing (CMP) process.

6. The method of claim 1, wherein the air gaps each have a thickness up to approximately 1,000 nm.

7. The method of claim 1, wherein the air gaps farther surround at least portions of the conductive material within the vias.

8. The method of claim 1, wherein the underlying layer comprises another layer of the dielectric material.

9. The method of claim 1, wherein the underlying layer comprises a semiconductor wafer.

10. A device comprising:
an integrated circuit die; and
an interconnect structure disposed over a surface of the die, the interconnect structure having a number of levels, each level including
a layer of a dielectric material;

a layer of a permeable material, the permeable material having a thickness of less than approximately 250 nm and internal compressive stresses of less than approximately 200 MPa, wherein internal stresses in the permeable layer are tensile;

a conductor extending through the permeable layer and into the dielectric layer; and an air gap disposed between the dielectric layer and the permeable layer, the air gap surrounding at least portions of the conductor;

wherein the permeable material allows a thermally decomposed sacrificial material to escape to form the air gap.

11. The device of claim 10, wherein the permeable material comprises a material selected from a group consisting of SiN, SiC, SiCN, SiON, SiOC, and $SiO_2$.

12. The device of claim 10, wherein the thickness of the permeable layer is between approximately 50 and 100 nm.

13. The device of claim 10, wherein the air gap has a thickness up to approximately 1,000 nm.

14. The device of claim 10, wherein the permeable layer underlies a dielectric layer of an overlying level of the interconnect structure.

15. The device of claim 10, wherein the conductor comprises a conductive via extending through the dielectric layer to an underlying conductor.

16. The device of claim 15, wherein the conductor further comprises a conductive trace coupled with the conductive via.

17. The device of claim 10, wherein the conductor comprises copper.

18. A system comprising:

a memory; and a processing device coupled with the memory, the processing device including an integrated circuit die and an interconnect structure disposed over a surface of the die, the interconnect structure having a number of levels, each level including a layer of a dielectric material;

a layer of a permeable material, the permeable material having a thickness of less than approximately 250 nm and internal compressive stresses of less than approximately 200 MPa, wherein internal stresses in the permeable layer are tensile;

a conductor extending through the permeable layer and into the dielectric layer; and an air gap disposed between the dielectric layer and the permeable layer, the air gap surrounding at least portions of the conductor;

wherein the permeable material allows a thermally decomposed sacrificial material to escape to form the air gap.

19. The system of claim 18, wherein the permeable material comprises a material selected from a group consisting of SiN, SiC, SiCN, SiON, SiOC, and $SiO_2$.

20. The system of claim 18, wherein the thickness of the permeable layer is between approximately 50 and 100 nm.

21. The system of claim 18, wherein the air gap has a thickness up to approximately 1,000 nm.

22. The system of claim 18, wherein the permeable layer underlies a dielectric layer of an overlying level of the interconnect structure.

23. The system of claim 18, wherein the conductor comprises a conductive via extending through the dielectric layer to an underlying conductor.

24. The system of claim 23, wherein the conductor further comprises a conductive trace coupled with the conductive via.

25. The system of claim 18, wherein the conductor comprises copper.

* * * * *